United States Patent [19]

Matsumura et al.

[11] Patent Number: 4,536,816
[45] Date of Patent: Aug. 20, 1985

[54] THYRISTOR APPARATUS EMPLOYING LIGHT-TRIGGERED THYRISTORS

[75] Inventors: Susumu Matsumura, Osaka; Masao Yano; Nobuo Sashida, both of Kobe; Yoshihiko Yamamoto, Amagasaki, all of Japan

[73] Assignees: Susumu Jatsumura, Osaka; Mitsubishi Denki Kabushiki Kaisha, Tokyo, both of Japan

[21] Appl. No.: 497,495

[22] Filed: May 24, 1983

[30] Foreign Application Priority Data

Jul. 12, 1982 [JP] Japan .............................. 57-120835

[51] Int. Cl.³ .............................................. H02H 7/10
[52] U.S. Cl. ..................................... 361/91; 361/100; 361/56; 361/111; 363/54; 363/57; 363/58
[58] Field of Search ................... 361/100, 91, 56, 111, 361/88, 89; 363/54, 57, 58, 68

[56] References Cited

U.S. PATENT DOCUMENTS

| | | | |
|---|---|---|---|
| 3,599,075 | 8/1971 | Etter et al. | 363/57 |
| 3,865,438 | 2/1975 | Boksjo et al. | 363/54 |
| 3,881,147 | 4/1975 | Veda et al. | 363/57 |
| 3,962,624 | 6/1976 | Ostlund et al. | 363/68 |
| 4,084,206 | 4/1978 | Leowald et al. | 363/57 X |
| 4,084,221 | 4/1978 | Ogata | 363/54 |
| 4,313,156 | 1/1982 | Kobayashi et al. | 363/68 X |
| 4,371,909 | 2/1983 | Kano | 361/100 |
| 4,414,599 | 11/1983 | Kobayashi | 361/91 X |

Primary Examiner—Patrick R. Salce
Attorney, Agent, or Firm—Lowe, King, Price & Becker

[57] ABSTRACT

A thyristor apparatus employing light-triggered thyristors comprises forward voltage detecting circuits (15) and a thyristor number detecting circuit (17). The forward voltage detecting circuits (15) detect forward voltages applied to light-triggered thyristors (13) to provide detected signals. The thyristor number detecting circuit (17) is responsive to the detected signals to cause light-triggered thyristors in a thyristor arm (U) to be turned on simultaneously in the case where the number of the light-triggered thyristors being supplied with forward voltages is one or more but not more than a predetermined number. Accordingly, if and when an overvoltage is applied to the thyristor arm (U), overvoltage suppressing elements (14) are prevented from being damaged even if partial commutation failure occurs in the light-triggered thyristors.

8 Claims, 9 Drawing Figures

THYRISTOR APPARATUS EMPLOYING LIGHT-TRIGGERED THYRISTORS

BACKGROUND OF THE INVENTION

1. Field of the Invention

The present invention relates to a thyristor apparatus employing light-triggered thyristors. More specifically, the present invention relates to a thyristor apparatus comprising a protecting means capable of protecting the light-triggered thyristors from an overvoltage.

2. Description of the Prior Art

A thyristor apparatus is widely used as an alternating current/direct current converting apparatus in, for example, a direct current power transmission system for transmitting electric power in the form of a direct current, a thyristor starting apparatus for starting a synchronous motor, and the like.

FIG. 1 is a schematic diagram of a conventional thyristor apparatus employing thyristors being triggered with an electrical signal. Six thyristor arms U, V, W, X, Y and Z are connected between alternating current terminals R, S and T and direct current terminals P and N. Each thyristor arm includes a plurality of thyristors 1 connected in series. The thyristors 1 each may be a thyristor to be triggered with an electrical signal. In the case where a thyristor apparatus 8 is used in a direct current power transmission system, usually the same is used in a high voltage higher than 120 KV and therefore as many as 100 of the thyristors 1 are connected in series. The gate of each thyristor 1 is connected to a trigger signal amplifying circuit 2 which comprises a photosensitive device 3 such as a photodiode, phototransistor or the like. An overvoltage preventing circuit 4 is connected between the anode and the gate of each thyristor 1. Each overvoltage preventing circuit 4 comprises a current suppressing resistor 4a and a non-linear resistive element 4b connected in series. On the other hand, a light trigger signal generating circuit 6 is provided on the part of the ground. The light trigger signal generating circuit 6 comprises a plurality of light emitting elements 6a of such as light emitting diodes and a transistor 6b connected in series between a positive direct current control voltage terminal 6c and a direct current control voltage common terminal 6d. The light emitting elements 6a and the photosensitive devices 3 are coupled by optical fibers 5, respectively. The base of the transistor 6b is connected to an electrical trigger signal generating circuit 7. The electrical trigger signal generating circuit 7 may comprise a trigger signal generator employing a voltage controlled oscillator and examples of such generator are shown in U.S. Pat. Nos. 2,467,765; 3,047,789; and 3,197,691 and U.S. No. 382,015. These United States patents and United States patent application are incorporated herein by reference.

Now an operation of the circuit shown in FIG. 1 will be described. First an operation in a normal case will be described. The electrical trigger signal generating circuit 7 provides a trigger signal determined in accordance with various conditions such as the condition of the direct current circuit, the condition of the alternating current circuit and the like. The transistor 6b is responsive to the trigger signal to be turned on, so that light trigger signals are simultaneously provided from the respective light emitting elements 6a. The respective photosensitive devices 3 serve to convert these light trigger signals into electrical trigger signals. The trigger signal amplifying circuit 2 serves to amplify these electrical trigger signals to provide the amplified outputs to the gates of the respective thyristors 1. As a result, the thyristor apparatus 8 serves as an alternating current/direct current converting apparatus for performing mutual conversion between an alternating current power and a direct current power, for example.

Now a description is given of an operation in the case where an overvoltage is supplied to the respective thyristor arms, for example, to the thyristor arm U. Since the thyristors 1 are damaged when the same are supplied with an overvoltage exceeding the rated voltage, the overvoltage preventing circuit 4 is provided to prevent the same. The non-linear resistive element 4b of the overvoltage preventing circuit 4 is adapted such that a current starts flowing at 3800 V in the case where the rated voltage of the thyristor 1 is 4000 V, for example. Accordingly, if and when an overvoltage is applied to the thyristor 1, a current flows through the non-linear resistive element 4b to the gate of the thyristor 1, whereby the thyristor 1 is turned on. Meanwhile, the current suppressing resistor 4a serves to control a current flowing into the gate of the thyristor 1 at that time. If one thyristor 1 is turned on due to the overvoltage, the above described overvoltage is also applied to the other thyristors 1 and as a result these other thyristors 1 are also turned on. Such a phenomenon as described above occurs in succession and all of the thyristors 1 in the thyristor arm U are turned on, whereby the thyristors 1 are protected from the overvoltage. Meanwhile, although the above described method of protecting the thyristors could cause a commutation failure of the thyristor apparatus 8, this does not entail any problem in an operation of the thyristor apparatus 8. More specifically, such commutation failure occurs only for one cycle and the thyristor apparatus 8 performs a normal operation in the next cycle and thus the commutation failure of one cycle can be neglected.

There are two types of cases where an overvoltage is applied to the thyristors 1, as described previously. One is a case where an overvoltage of such as a lighting surge, a switching surge or the like is applied from outside of the thyristor apparatus 8 and the other is a case where a partial commutation is caused in the thyristor arm, in which case some of the thyristors are triggered while the remaining ones are not triggered, with the result that an overvoltage is applied to the thyristors not triggered. Now an occurrence of the phenomenon of partial commutation will be described in the following.

First a concept of a margin time of commutation of a thyristor will be described. Generally, in order to turn off the thyristor in a conduction state to render it in a non-conduction state, a reverse voltage is applied to the thyristor so that a current may be caused to flow temporarily in a reverse direction. However, if and when a forward voltage is applied immediately at a time point when the forward current of the thyristor becomes zero, the thyristor is placed again in a conduction state, without application of a trigger signal, due to carriers remaining in the thyristor. Accordingly, a period of time longer than a turn-off time of the thyristor is required from the time point when the forward current of the thyristor becomes zero until the forward voltage of the thyristor is applied again. A period of time after the current flowing into the thyristor becomes zero until a forward voltage is applied again to the thyristor is referred to as a margin time of commutation $\gamma$. In order to turn off the thyristor belonging to a certain thyristor arm in a thyristor apparatus, a circuit need be designed such that the margin time of commutation may be longer than a turn-off time of the thyristor. However, there could be a case where the margin time of commutation $\gamma$ is shorter than a turn-off time of the thyristor depending on the operation state of the thyristor apparatus. This will be described in the following with reference to FIGS. 2 to 5.

FIG. 2 is a circuit diagram for a conventional inverter. The thyristor apparatus 8 as shown in FIG. 1 can function as either an inverter or a converter, but to make the description simpler, a case where the thyristor apparatus 8 is used as an inverter will be explained here. Direct current terminals P and N of the thyristor apparatus 8 are connected through a direct current reactor 10 across a direct current power supply 9. Alternating current terminals R, S and T are connected to an alternating current power supply 11. Further, the alternating current terminals R, S and T are grounded through a grounding transformer 12. The direct current power from the direct current power supply 9 is converted by the thyristor apparatus 8 into alternating current power and provided for the alternating current power supply 11. The commutations of the thyristor arms U, V, W, X, Y and Z in the thyristor apparatus 8 are done by the voltages of the alternating current power supply 11; namely, the thyristor apparatus 8 operates as a line commutation type inverter.

FIG. 3 is a chart showing electrical signal waveforms at each section shown in FIG. 2. At the top of FIG. 2, current-carrying thyristor arms are indicated. Below that, the working alternating current potential $V_{AC}$ and trigger signals TS for the thyristors are indicated. And below that, the voltage $V_U$ of the thyristor arm U is indicated. And at the bottom, the direct current voltage $V_{PN}$ between the direct current terminals P and N is indicated. After a current has passed through the thyristor arm U, the thyristor arm V is triggered, then, in succession to an overlap angle u, an interphase voltage between the phases S and R is applied to the thyristor arm U as a reverse voltage. Consequently, the thyristor arm U is provided with the margin time of commutation $\gamma$. The margin time of commutation $\gamma$ is usually lasts longer than a turn-off time of a thyristor, but it may happen that it becomes shorter than the turn-off time of a thyristor depending upon variations in supply voltages, load currents and so on. More particularly, when the neutral point of the alternating current power supply 11 shown in FIG. 2 is grounded, it is common knowledge that, if one line of the alternating current circuit is grounded, the alternating current interphase voltage will advance by a phase angle of 30° from a normal state. This will be explained with reference to FIG. 4. FIG. 4 is a vector diagram showing the interphase voltage between the phases R and S. If the phase R is grounded, for example, the voltage $V_{RS}'$ between the phases R and S at the time of the occurrence of the grounding will advance by a phase angle of 30° from the voltage $V_{RS}$ between the phases R and S at a normal state. On that occasion, the reverse voltage applied to the thyristor arm U is also advanced by a phase angle of 30°, and consequently the margin time of commutation $\gamma$ becomes shorter. This will be explained with reference to FIG. 5. FIG. 5 is an enlarged detail of the portion A in FIG. 3. The voltage $V_U$ of the thyristor arm U at a normal state is indicated with a solid line in FIG. 5, when the margin time of commutation is $\gamma$. The voltage $V_U'$ of the thyristor arm U at the time when the phase R is grounded is shown with a dotted line in FIG. 5, when the margin time of commutation becomes $\gamma'$. As seen from the drawing, the margin time of commutation $\gamma'$ at the time the grounding occurs becomes shorter than the margin time of commutation $\gamma$ at a normal state.

In general, each of the thyristors in each thyristor arm is provided with a voltage dividing circuit comprising a capacitor and a resistor for balancing the voltages to be borne by these thyristors. However, in many thyristors, there are always some with longer turn-off times and others with shorter turn-off times due to unequality in their characteristics from product to product. Hence, if the margin time of commutation obtainable from the circuit lies between the longer turn-off times and the shorter turn-off times, the thyristors with shorter turn-off times will, when the margin time of commutation has elapsed and the forward voltage is applied to them, have already restored the capability to bear the voltage, whereas those thyristors with longer turn-off times will not have become similarly restored. As a result, the thyristor with longer turn-off times will fail in the turning off and will not bear the forward voltage, and the situation thus leads to the state where the total voltage applied to the thyristor arm is impressed only on part of thyristors with shorter turn-off times. In such a manner, certain thyristors are subjected to an overvoltage on account of the partial commutation failure. The overvoltage preventing circuit 4 shown in FIG. 1 is for protecting the thyristor 1 from the overvoltage just described.

Recently, light-triggered thyristors to be turned on by light have come to be used for a high voltage thyristor apparatus. This is because, by the use of the light-triggered thyristors, the photosensitive devices and trigger signal amplifying circuits that were necessary for the conventional electrical signal-triggered thyristor have become unnecessary, the number of component parts has been decreased, the reliability of the thyristor apparatus has been improved, and further its anti-noise property has been bettered. FIG. 6 is a circuit diagram for a conventional thyristor apparatus employing light-triggered thyristors. Only its difference from the thyristor apparatus as shown in FIG. 1 will be explained below. Each of thyristor arms U, V, W, X, Y and Z includes light-triggered thyristors 13 which are connected in series. Optical fibers 5 are coupled with the light-triggered thyristors 13, respectively. Each light-triggered thyristor 13 is turned on by the light trigger signal outputted from the light trigger signal generating circuit 6, and performs a predetermined operation. However, since the light-triggered thyristor cannot be turned on by an electrical signal, there was a problematic point that the apparatus was unable to use an overvoltage preventing circuit 4 as shown in FIG. 1 which protects a thyristor from an overvoltage by turning on a thyristor by an electrical signal. Hence, such thyristor apparatus employing light-triggered thyristors that are provided with effective overvoltage protecting means have been wanted.

SUMMARY OF THE INVENTION

This invention, in summary, is a thyristor apparatus employing light-triggered thyristors and comprising a plurality of light-triggered thyristors connected in series and responsive to light trigger signals to be turned on, light trigger signal generating means for providing the light trigger signals for the light-triggered thyristors, a plurality of overvoltage suppressing means for suppressing overvoltages which are impressed on the light-triggered thyristors, a plurality of forward voltage detecting means for detecting forward voltages that are applied to some light-triggered thyristors and for generating the detected signals and thyristor number detecting means responsive to the detected signals for activating the light trigger signal generating means when the number of the light-triggered thyristors to which forward voltages are applied is one or more but not more than a predetermined number.

According to the present invention, the light-triggered thyristors usually respond to the light trigger signals from the light trigger signal generating means and perform a predetermined operation. When an overvoltage is impressed on a thyristor arm, the light-triggered thyristors are protected by the overvoltage suppressing means. Meanwhile, the forward voltage detecting means detect the forward voltages applied to the light-triggered thyristors and issue the detected signals. The thyristor number detecting means is responsive to the detected signals to activate the light trigger signal generating means when the number of the light-triggered thyristors is one or more but not more than a predetermined number. As a result, the light-triggered thyristors in one thyristor arm are turned on simultaneously. Consequently, it has been confirmed that, even if an overvoltage is impressed on a thyristor arm and partial commutation failure is thereby caused, the overvoltage suppressing means will not be damaged.

Accordingly, an object of the present invention is to provide a thyristor apparatus including protecting means for protecting light-triggered thyristors from overvoltages.

A primary advantage of the present invention is that the light-triggered thyristors can be protected from overvoltages by suppressing the overvoltages impressed on the light-triggered thyristors.

Another advantage of the present invention is that the overvoltage suppressing means is prevented from being damaged by watching the number of the thyristors to which forward voltages are applied.

A further advantage of the present invention is that it is not necessary to provide the overvoltage suppressing means with so great a heat resisting capability.

Still another advantage of the present invention is that a comparatively long time is allowed for generation of the light trigger signals so long as it is within the limits permissible by the heat resisting capability of the overvoltage suppressing means and hence the control circuit can be constructed easily.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 6:
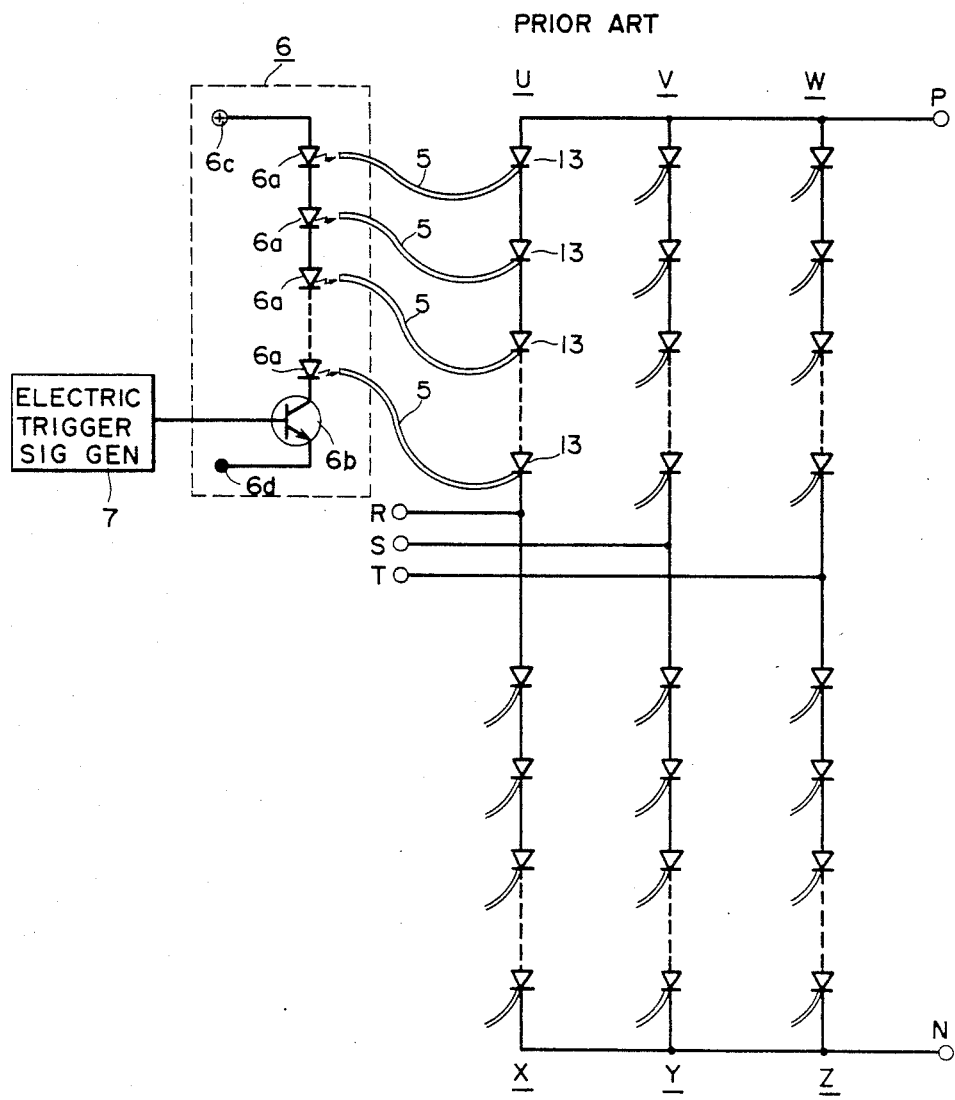
FIG. 6 is a circuit diagram for a conventional thyristor apparatus employing light-triggered thyristors.
Figure 7:
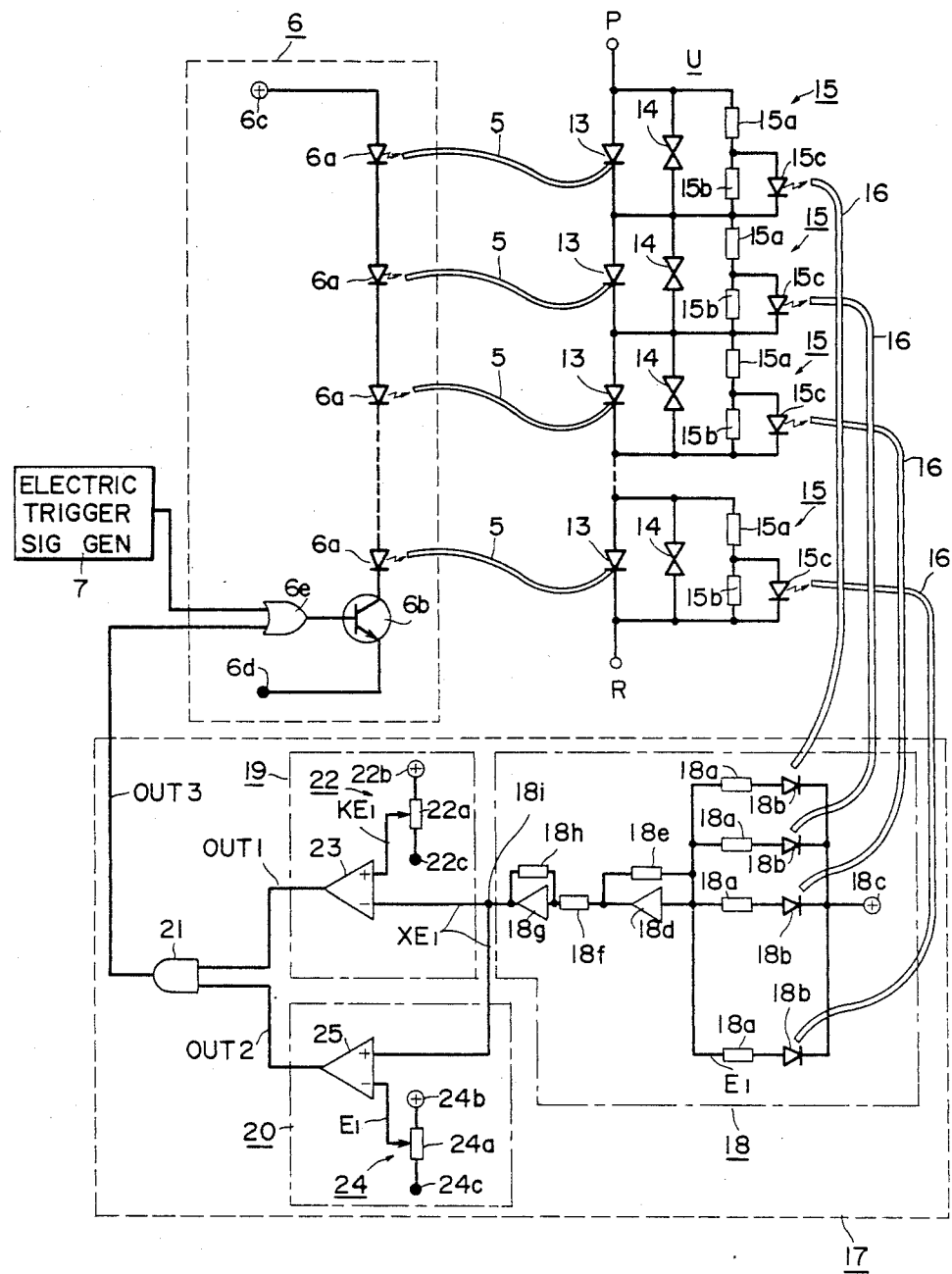
FIG. 7 is a circuit diagram showing one embodiment of the present invention.

FIG. 7 is a circuit diagram showing one embodiment of the present invention. Although the circuit diagram only shows circuits for the phase U, the same is also applicable to other phases. A description of the circuits will be given below chiefly with regard to the difference between these circuits and with the circuits shown in FIG. 6.

First a general structure and an operation will be described. The thyristor arm U includes a plurality of light-triggered thyristors 13 connected in series. Each of the light-triggered thyristors 13 is provided with an overvoltage suppressing element 14 of zinc oxide or the like connected in parallel therewith. Each of the light-triggered thyristors 13 is further provided with a forward voltage detecting circuit 15 connected in parallel therewith. The output section of the forward voltage detecting circuit 15 is connected through an optical fiber 16 to the input section of the thyristor number detecting circuit 17 being provided on the ground side. The output section of the thyristor number detecting circuit 17 is connected to the input section of the light trigger signal generating circuit 6. Each of the light-triggered thyristors 13 is turned on by the light trigger signal from the light trigger signal generating circuit 6. Each overvoltage suppressing element 14 suppresses the overvoltage which is impressed on each of the light-triggered thyristors 13. Each of the forward voltage detecting circuits 15 detects a forward voltage which is applied to each of the light-triggered thyristors 13 and generates a detected signal. The thyristor number detecting circuit 17, in response to the detected signal, activates the light trigger signal generating circuit 6 when the number of the light-triggered thyristors 13 to which forward voltages are applied is one or more but not more than a predetermined number. As a result, if and when an overvoltage has been impressed on the thyristor arm U, a partial commutation failure has occurred in the light-triggered thyristors, and only a number of the light-triggered thyristors not more than the predetermined number have restored their voltage bearing capabilities, then the light-triggered thyristors 13 in the thyristor arm U are all turned on simultaneously. Hence the overvoltage suppressing element 14 is not damaged.

Now a description of a detailed construction and an operation of the circuit shown in FIG. 7 will be given. Each of the forward voltage detecting circuit 15 includes voltage-dividing resistors 15a and 15b connected in parallel with the light-triggered thyristor 13 and a light-emitting element 15c of light-emitting diode or the like connected in parallel with the voltage dividing resistor 15b. Each light-emitting element 15c is coupled with the optical fiber 16. The thyristor number detecting circuit 17 includes a voltage generating circuit 18, comparison circuits 19 and 20 and an AND gate 21. In the voltage generating circuit 18, a plurality of circuits are connected in parallel, each circuit including a resistor 18a and a photosensitive device 18b connected in series, are inserted between a positive end terminal 18c of a direct current control power supply and an operational amplifier 18d. The photosensitive device 18b is for example of photodiode, phototransistor or the like. A resistor 18e is connected between the input and the output of the operational amplifier 18d in parallel therewith. The output section of the operational amplifier 18d is connected through a resistor 18f to the input section of an operational amplifier 18g. A resistor 18h is connected between the input and the output of the operational amplifier 18g in parallel therewith. The output section of the operational amplifier 18g is connected to the output terminal 18i. The comparison circuit 19 includes a voltage generating circuit 22 and a comparator 23. The voltage generating circuit 22 is formed of a variable resistor 22a connected between a positive end terminal 22b of the direct current control power supply and the common end terminal 22c of the direct current control power supply, the sliding section of the variable resistor 22a being connected to a positive input section of the comparator 23. A negative input section of the comparator 23 is connected to the output terminals 18i. The output section of the comparator 23 is connected to one terminal of the input section of the AND gate 21. The comparing circuit 20 includes a voltage generating circuit 24 and a comparator 25. The voltage generating circuit 24 is formed of a variable resistor 24a connected between a positive end terminal 24b of the direct current control power supply and the common end terminal 24c of the direct current control power supply, the sliding section of the variable resistor 24a being connected to a negative input section of the comparator 25. A positive input section of the comparator 25 is connected to the output terminal 18i. The output section of the comparator 25 is connected to the other terminal of the input section of the AND gate 21. The output section of an OR gate 6e is connected to the base of a transistor 6b in the light trigger signal generating circuit 6. One terminal of the input section of the OR gate 6e is connected to the output section of an electrical trigger signal generating circuit 7 and the other terminal of the input section is connected to the output section of the AND gate 21.

Figure 8:
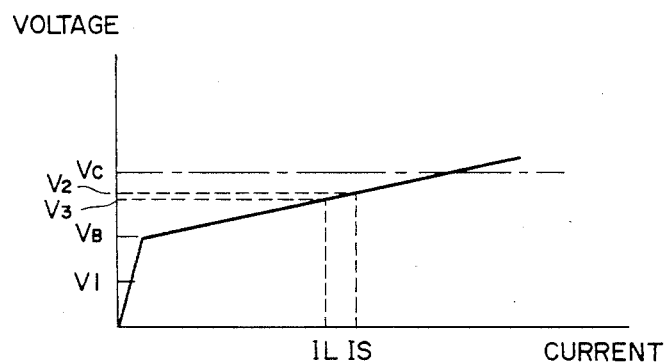
FIG. 8 is a graph showing voltage-current characteristics of the over-voltage suppressing element.

Now even if overvoltages are impressed on the light-triggered thyristors 13, the overvoltage are suppressed under withstand voltages of the light-triggered thyristors 13 by means of the overvoltage suppressing elements 14. This will be explained referring to FIG. 8. FIG. 8 is a graph showing voltage-current characteristics of the overvoltage suppressing element 14. The overvoltage suppressing element 14 hardly conducts a current when the voltage applied to it is lower than a breakdown voltage $V_B$ thereof but conducts a large current when a higher voltage than the breakdown voltage $V_B$ is applied to it. Hence, the overvoltage suppressing element 14 serves to suppress an overvoltage to be impressed on such a device to be protected as the light-triggered thyristor 13 or the like. When, under a normal operating condition, the total number of the light-triggered thyristors in one thyristor arm (for example 100 pieces) can bear the voltage, the voltage which is applied to one light-triggered thyristor 13 may be a lower voltage $V_1$ than the breakdown voltage $V_B$ of the overvoltage suppressing element 14. Even if a lightning surge or switching surge is impressed on the thyristor arm U from the outside, the overvoltage suppressing element 14 conducts a surge current $I_S$ to keep the voltage across it to $V_2$, thereby suppressing the voltage impressed on the thyristor 13 under its withstand voltage $V_C$.

If, however, a phenomenon of the partial commutation failure should occur as described earlier due to conditions in the circuit and only a predetermined number, for example, 50 or less out of 100 light-triggered thyristors should have restored the voltage bearing capabilities, the voltage to be impressed on one light-triggered thyristor which has restored the voltage bearing capability would reach a value that exceeds the voltage $V_B$. That is, a maximum voltage to be impressed on one light-triggered thyristor would become a voltage $V_3$ which is a voltage occurring across the overvoltage suppressing element 14 when a current $I_L$ from the direct current circuit flows therethrough. Since the voltage $V_3$ is lower than the withstand voltage $V_C$ of the light-triggered thyristor 13, the light-triggered thyristor 13 would be protected, but a current from the direct current circuit would flow through the overvoltage suppressing element 14 over an allowable span of time producing large Joule heat and damaging the overvoltage suppressing element 14. This phenomenon will become more pronounced with the decrease in number of the light-triggered thyristors restoring the voltage bearing capability. Even in such an event, the damage of the overvoltage suppressing element 14 will be prevented if it is made in a very large size to increase greatly its heat resistivity. This approach, however, is not practical since it makes the thyristor apparatus larger and its cost higher. The phenomenon which causes a large current flow in the overvoltage suppressing element 14 does not frequently occur. It is therefore quite wasteful to make a thyristor apparatus very large only in order to cope with such a phenomenon.

Figure 1:
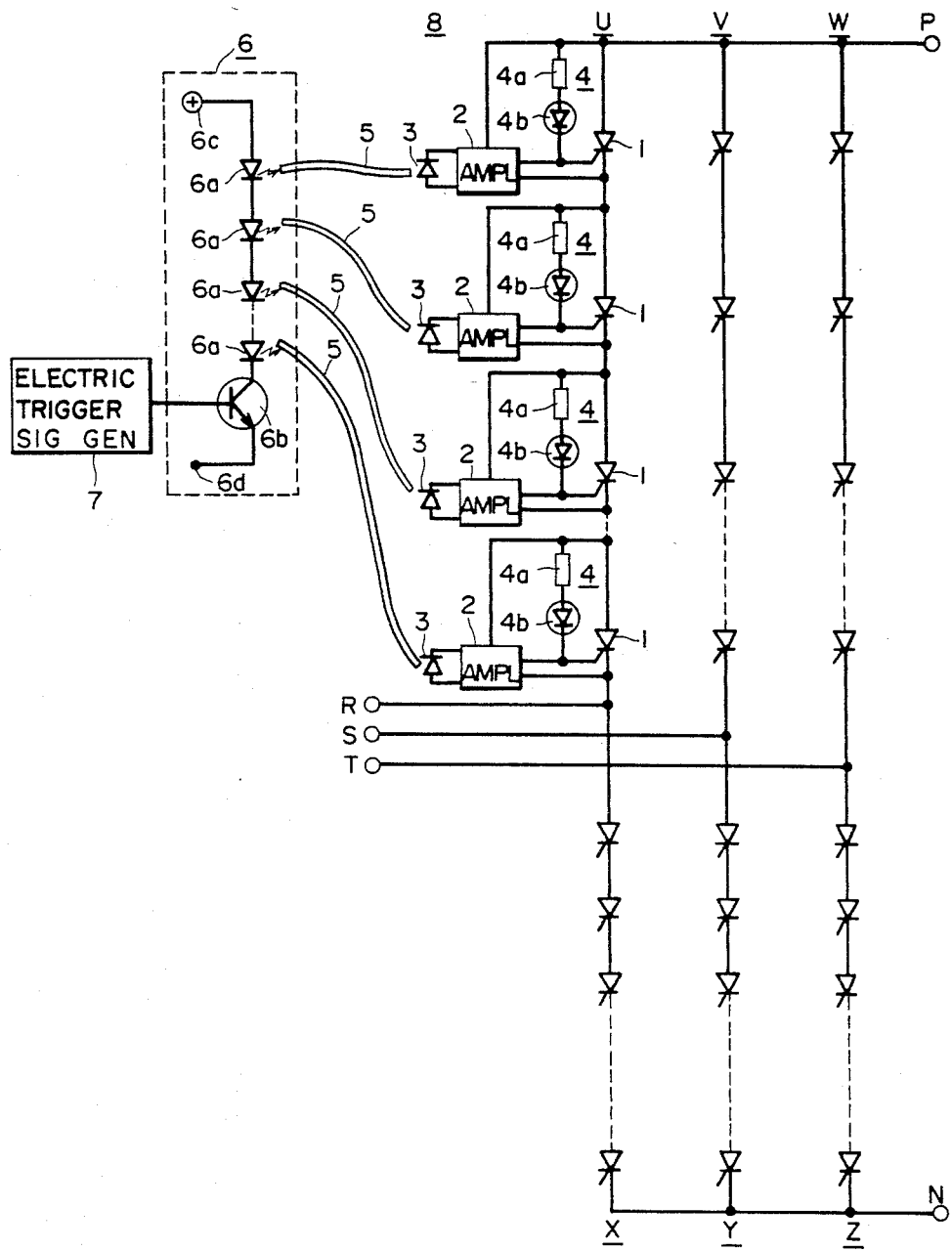
FIG. 1 is a circuit diagram showing a conventional thyristor apparatus employing thyristors to be turned on by electrical signals.
Figure 2:
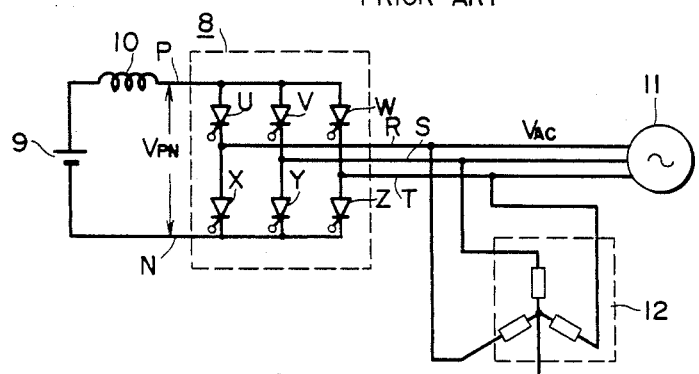
FIG. 2 is a circuit diagram showing a conventional inverter.
Figure 3:
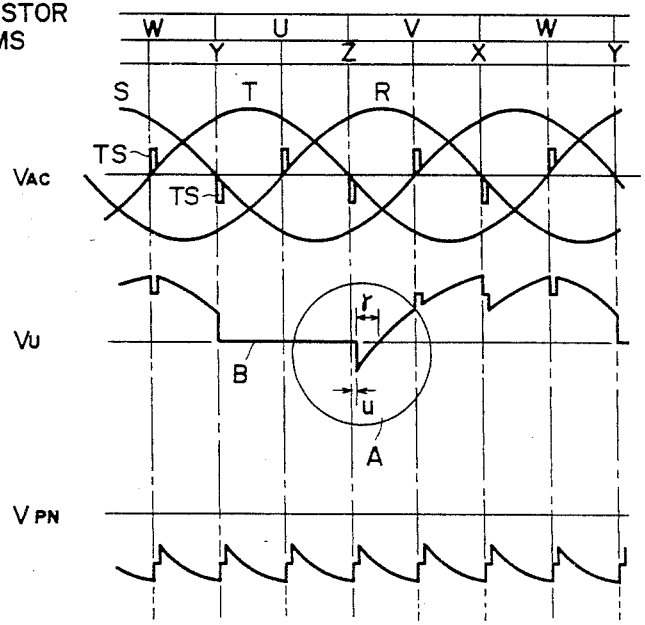
FIG. 3 is a chart showing electrical signal waveforms at each section shown in FIG. 2.
Figure 4:
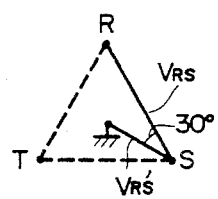
FIG. 4 is a vector diagram showing the interphase voltage between the phases R and S shown in FIG. 2.
Figure 5:
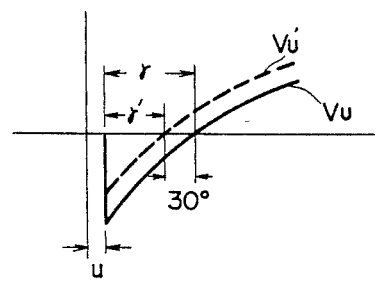
FIG. 5 is an enlarged detail of the portion A in FIG. 3.
Figure 9:
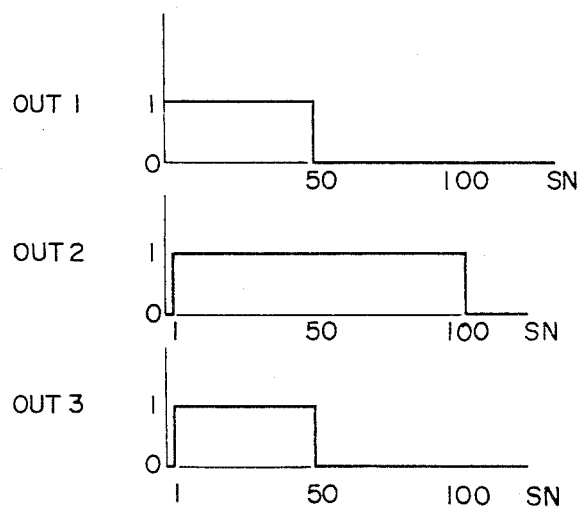
FIG. 9 is a chart showing operation of the thyristor number detecting circuit.

According to the present invention, in the case where the number of the light-triggered thyristors restoring voltage bearing capability is not more than a predetermined number, all the light-triggered thyristors in the thyristor arm are simultaneously turned on and thereby the damage of the overvoltage suppressing element 14 is prevented. More particularly, referring to FIG. 7, each light emitting element 15c emits light and issues a detected signal when a forward voltage is applied to the light-triggered thyristor 13. Under a normal operating condition, if one light emitting element 15c is emitting light, then all the light emitting elements 15c in the thyristor arm U may be emitting light simultaneously. If, however, the partial commutation failure occurs as earlier described, then only the number of light-triggered thyristors 13, which number, is not more than a predetermined number may have restored the voltage bearing capability, and hence only this number of light emitting elements 15c may emit light and issue the detected signal. The detected signals from these light emitting elements 15c are received through the optical fibers 16 by the photosensitive devices 18b in the voltage generating circuit 18. The resistors 18a and photosensitive devices 18b, upon receipt of the detected signals, generate voltages $E_1$. The voltages $E_1$ are added by the operational amplifier 18d connected for adding and the polarity is reversed by the operational amplifier 18g connected for inverting. As a result, at the output terminal 18i, the voltage $E_1$ is provided when the number of the light-triggered thyristor 13 which has restored the voltage bearing capability is one, the voltage $2E_1$ is provided when the number is two, and the voltage $XE_1$ is provided when the number is X. Namely, the voltage generating circuit 18 generates the voltage $XE_1$ corresponding to the number X of the light-triggered thyristors 13 to which forward voltages have been applied. Meanwhile, the voltage generating circuit 22 in the comparison circuit 19 generates the voltage $KE_1$, where K is such a number that, if the number of the light-triggered thyristors 13 which have restored the voltage bearing capability when the partial commutation failure occurred were not more would damage the voltage suppressing elements 14. For example, when the number of thyristors 13 in the thyristor arm U is 100, the number K may be 50. The voltage $XE_1$ from the voltage generating circuit 18 and the voltage $KE_1$ from the voltage generating circuit 22 are compared by the comparator 23. An output signal OUT1 from the comparator 23 becomes "1" if $XE_1 \leq KE_1$, and "0" if $XE_1 > KE_1$. Namely, the comparison circuit 19 issues the output signal OUT1 which is "1" if the number of the light-triggered thyristors 13 to which the forward voltages are applied is not more than the predetermined number K. Meanwhile, the voltage generating circuit 24 in the comparison circuit 20 generates the earlier mentioned voltage $E_1$. This voltage $E_1$ and the voltage $XE_1$ from the voltage generating circuit 18 are compared by the comparator 25. An output signal OUT2 from the comparator 25 becomes "0" when $XE_1 < E_1$, and "1" when $XE_1 \geq E_1$. Namely, the comparison circuit 20 issues the output signal OUT2 which is "1" if the number of the light-triggered thyristors 13 to which forward voltages are applied is not less than 1. The reason why the comparison circuit 20 is provided is as follows. Even if the thyristor apparatus is operating normally, there is a moment when no voltage or negative voltage is being applied to each thyristor arm (cf. portions A and B in FIG. 3). At that time, the output signal OUT1 from the comparison circuit 19 will be "1" and, therefore, if the comparison circuit 20 were not provided, then all the light-triggered thyristors 13 in the thyristor arm U would be turned on. Occurrence of such turning on in a normal operating state should be avoided and therefore the comparison circuit 20 is provided. The AND gate 21 evaluates a logical product of the output signals OUT1 and OUT2 and issues an output signal OUT3. That will be made clearer if FIG. 9 is referred to. FIG. 9 is a chart showing the function of the thyristor number detecting circuit. The abscissas represent numbers of the light-triggered thyristors SN and the ordinates represent the output signal OUT1 of the comparison circuit 19, the output signal OUT2 of the comparison circuit 20 and the output signal OUT3 of the AND gate 21, respectively, where the earlier described number K is taken at 50. As noted from the chart, the thyristor number detecting circuit 17 issues the output signal OUT3 of "1" in the case where the number of the light-triggered thyristors 13 to which forward voltages are applied is one or more but not more than 50.

Again referring to FIG. 7, the output signal OUT3 is applied through the OR gate 6e in the light trigger signal generating circuit 6 to the base of the transistor 6b to make the light emitting elements 6a emit light simultaneously. All the light-triggered thyristors 13 in the thyristor arm U are thereby turned on simultaneously. Thus, the voltages impressed on the overvoltage suppressing elements 14 are removed and the elements are prevented from being damaged. Incidentally, as already described, the above procedure for protecting the overvoltage suppressing elements 14 is an occurrence to be completed within one cycle and therefore it exerts a bad influence upon neither operation of the thyristor apparatus nor the light-triggered thyristors themselves. Therefore, according to the present invention, it is not necessary to make the heat resisting capability of the overvoltage suppressing elements 14 very high. If any overvoltage suppressing element 14 were not provided, the light-triggered thyristors 13 would be damaged unless the light trigger signal is generated immediately upon detection of an occurrence of the partial commutation failure. According to the present invention, however, the light trigger signal may be generated comparatively slowly within a tolerance of the heat resisting capability of the overvoltage suppressing element 14 and this makes the construction of the control circuit easier.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thyristor apparatus employing light-triggered thyristors, comprising:

a plurality of light-triggered thyristors (13) connected in series and responsive to light trigger signals to be turned on, light trigger signal generating means (6) optically connected to said light-triggered thyristors for providing light trigger signals for said light-triggered thyristors, a plurality of overvoltage suppressing means (14) connected in parallel with said light-triggered thyristors, respectively, for suppressing overvoltages to be impressed on said light-triggered thyristors, a forward voltage detector comprising a plurality of forward voltage detecting means (15) connected in parallel with said light-triggered thyristors, respectively, for detecting forward voltages applied to said light-triggered thyristors and for generating detected signals, and thyristor number detecting means (17) connected to said light trigger signal generating means and to said forward voltage detector and responsive to said detected signals for activating said light trigger signal generating means when the number of light-triggered thyristors to which forward voltages are applied is one or more but not more than a predetermined number (K), said thyristor number detecting means (17) comprising;

first voltage generating means (18) connected to said forward voltage detector, responsive to said detected signals, for generating a first voltage ($XE_1$) corresponding to the number of light-triggered thyristors to which the forward voltages are applied, first comparison means (19) connected to said first voltage generating means for comparing said first voltage ($XE_1$) with a second voltage ($KE_1$) which corresponds to a state wherein the number of light-triggered thyristors to which the forward voltages are applied is equal to said predetermined number and for generating a first output signal (OUT1) when the number of thyristors to which the forward voltages are applied is not more than the predetermined number, second comparison means (20) connected to said first voltage generating means for comparing said first voltage (XE$_1$) with a third voltage (E$_1$) which corresponds to a state wherein the number of light-triggered thyristors to which the forward voltage is applied is one and for generating a second output signal (OUT2) in the case when the number of thyristors to which the forward voltages are applied is not less than one, and logical product evaluating means (21) connected to said first and second comparison means and to said light trigger signal generating means for evaluating a logical product of said first and second output signals and for generating a third output signal (OUT3) to activate said light trigger signal generating means.

2. A thyristor apparatus employing light-triggered thyristors according to claim 1, wherein said first voltage generating means (18) comprises:

a plurality of second voltage generating means (18a and 18b) responsive to said detected signals for generating said third voltage (E$_1$), and operational amplifier means (18d and 18e) connected to said plurality of second voltage generating means for adding voltages therefrom.

3. A thyristor apparatus employing light-triggered thyristors according to claim 2, wherein each of said forward voltage detecting means (15) includes:

voltage dividing means (15a and 15b) connected in parallel with a respective light-triggered thyristor, and a light emitting element (15c) connected to said voltage-dividing means;

each of said second voltage generating means (18a and 18b) includes a resistor (18a) and a photosensitive device (18b) connected in series and inserted between said operational amplifier means (18d and 18e) and a direct current control power supply; and said light-emitting elements and said photosensitive devices are coupled by optical fibers (16), respectively.

4. A thyristor apparatus employing light-triggered thyristors according to claim 1, wherein said first comparison means (19) comprises:

further voltage generating means (22) for generating said second voltage (KE$_1$), and a comparator (23) for comparing said first voltage (XE$_1$) with said second voltage (KE$_1$) and for issuing said first output signal in the case where said first voltage is not more than said second voltage.

5. A thyristor apparatus employing light-triggered thyristors according to claim 1, wherein said second comparison means (20) comprises:

additional voltage generating means (24) for generating said third voltage (E$_1$), and a comparator (25) for comparing said first voltage (XE$_1$) with said third voltage (E$_1$) and for generating said second output signal in the case where said first voltage is not less than said third voltage.

6. A thyristor apparatus employing light-triggered thyristors according to claim 1, wherein said first voltage generating means (18) comprises:

a plurality of second voltage generating means (18a and 18b) each responsive to a respective one of said detected signals for generating said third voltage (E$_1$), and operational amplifier means (18d and 18e) connected to said plurality of second voltage generating means for adding voltages therefrom.

7. A thyristor apparatus employing light-triggered thyristors, comprising:

a plurality of light-triggered thyristors (13) connected in series and responsive to light trigger signals to be turned on, light trigger signal generating means (6) optically connected to said light-triggered thyristors for providing light trigger signals for said light-triggered thyristors, a plurality of overvoltage suppressing means (14) connected in parallel with said light-triggered thyristors, respectively, for suppressing overvoltages to be impressed on said light-triggered thyristors, a forward voltage detector comprising a plurality of forward voltage detecting means (15) connected in parallel with said light-triggered thyristors, respectively, for detecting forward voltages applied to said light-triggered thyristors and for generating detected signals, and thyristor number detecting means (17) for counting a number of thyristors to which forward voltages are applied, said thyristor number detecting means connected to said light trigger signal generating means and to said forward voltage detector and responsive to said detected signals for activating said light trigger signal generating means when the number of light-triggered thyristors to which forward voltages are applied is one or more but not more than a predetermined number (K), said thyristor number detecting means comprising:

first voltage generating means (18) connected to said forward voltage detector responsive to said detected signals, for generating a first voltage (XE$_1$) corresponding to the number of light-triggered thyristors to which the forward voltages are applied, first comparison means (19) connected to said first voltage generating means for comparing said first voltage (XE$_1$) with a second voltage (KE$_1$) which corresponds to a state wherein the number of light-triggered thyristors to which the forward voltages are applied is equal to said predetermined number and for generating a first output signal (OUT1) when the number of thyristors to which the forward voltages are applied is not more than the predetermined number, second comparison means (20) connected to said first voltage generating means for comparing said first voltage (XE$_1$) with a third voltage (E$_1$) which corresponds to a state wherein the number of light-triggered thyristors to which the forward voltage is applied is one and for generating a second output signal (OUT2) in the case when the number of thyristors to which the forward voltages are applied is not less than one, and logical product evaluating means (21) connected to said first and second comparison means and to the light trigger signal generating means for evaluating a logical product of said first and second output signals and for generating a third output signal (OUT3) to activate said light trigger signal generating means.

8. In a thyristor apparatus having a plurality of series connected light-triggered thyristors, and a light-trigger signal generator optically connected to said thyristors for providing light-trigger signals thereto for turning on said thyristors, the improvement comprising:

forward voltage detecting means for detecting forward voltages applied to said light-triggered thyristors and for generating detection signals indicative thereof, and thyristor counting means connected to said light-trigger signal generator and to said forward voltage detecting means for counting the number of thyristors having a forward voltage applied thereto and for activating said light-trigger signal generator to provide said light-trigger signal to each of said thyristors when the count of thyristors having said forward voltage applied thereto is within a predetermined range, said thyristor counting means comprising:

first voltage generating means connected to said forward voltage detecting means, responsive to said detection signals, for generating a first voltage corresponding to the number of light-triggered thyristors to which the forward voltages are applied, first comparison means connected to said first voltage generating means for comparing said first voltage with a second voltage which corresponds to a state wherein the number of light-triggered thyristors to which the forward voltages are applied is equal to an upper limit of said predetermined range and for generating a first output signal when the number of thyristors to which the forward voltages are applied is within said predetermined range, second comparison means connected to said first voltage generating means for comparing said first voltage with a third voltage which corresponds to a state wherein the number of light-triggered thyristors to which the forward voltage is applied is one and for generating a second output signal in the case when the number thyristors to which the forward voltages are applied is not less than one, and logical product evaluating means connected to said first and second comparison means and to the light trigger signal generator for evaluating a logical product of said first and second output signals and for generating a third output signal to activate the light trigger signal generator.

* * * * *

UNITED STATES PATENT AND TRADEMARK OFFICE
CERTIFICATE OF CORRECTION

PATENT NO. : 4,536,816
DATED      : August 20, 1985
INVENTOR(S) : Susumu MATSUMURA, Masao YANO, Nobuo SASHIDA and Yoshihiko YAMAMOTO It is certified that error appears in the above-identified patent and that said Letters Patent is hereby corrected as shown below:

Page 1, of the Patent, insert:

[73]   Assignees:   Matsumura Susumu c/o Kansai Electric Power Ltd., Osaka; Mitsubishi Denki Kabushiki Kaisha, Tokyo, Japan Signed and Sealed this First Day of July 1986

[SEAL]

Attest:

Attesting Officer

DONALD J. QUIGG

Commissioner of Patents and Trademarks